(12) United States Patent
Yeh et al.

(10) Patent No.: US 9,685,383 B2
(45) Date of Patent: Jun. 20, 2017

(54) METHOD OF FORMING SEMICONDUCTOR DEVICE

(71) Applicant: UNITED MICROELECTRONICS CORP., Hsin-Chu (TW)

(72) Inventors: Chiu-Hsien Yeh, Tainan (TW); Zhen Wu, Kaohsiung (TW); Yen-Cheng Chang, Kaohsiung (TW); Yu-Ting Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/711,752

(22) Filed: May 13, 2015

(65) Prior Publication Data

US 2016/0336194 A1    Nov. 17, 2016

(51) Int. Cl.

| H01L 21/321 | (2006.01) |
|---|---|
| H01L 21/283 | (2006.01) |
| H01L 21/308 | (2006.01) |
| H01L 21/8238 | (2006.01) |
| H01L 21/311 | (2006.01) |
| H01L 21/02 | (2006.01) |

(52) U.S. Cl.
CPC ........ H01L 21/823821 (2013.01); H01L 21/02041 (2013.01); H01L 21/31133 (2013.01)

(58) Field of Classification Search
None
See application file for complete search history.

(56) References Cited

U.S. PATENT DOCUMENTS

| 2004/0018743 A1* | 1/2004 | Kim ................ H01L 21/02071 438/725 |
| 2009/0197404 A1 | 8/2009 | Yang |
| 2012/0068261 A1* | 3/2012 | Kwon ................ H01L 27/0922 257/331 |
| 2012/0285481 A1* | 11/2012 | Lee ................ C23C 16/0245 134/1.1 |
| 2014/0363960 A1* | 12/2014 | Kim ................ H01L 21/82345 438/585 |
| 2016/0005602 A1* | 1/2016 | Yoo ................ H01L 21/0338 216/41 |

OTHER PUBLICATIONS

Yang, Title of Invention: Semiconductor Device and Method for Fabricating the Same, U.S. Appl. No. 14/557,387, filed Dec. 1, 2014.

* cited by examiner

*Primary Examiner* — Khaja Ahmad
(74) *Attorney, Agent, or Firm* — Winston Hsu (57) ABSTRACT

A method of forming a semiconductor device includes following steps. First of all, a first work function layer is formed on a substrate. Next, a first patterned photoresist layer is formed on the first work function layer. Then, the first work function layer is partially removed by using the first patterned photoresist layer as a mask to form a patterned first work function layer. Subsequently, the first patterned photoresist layer is removed by providing radical oxygen.

16 Claims, 5 Drawing Sheets

METHOD OF FORMING SEMICONDUCTOR DEVICE

BACKGROUND OF THE INVENTION

1. Field of the Invention

The present invention relates to a method of forming a semiconductor device, and more particularly, to a method of forming a semiconductor device having different work function layers for tuning threshold voltages.

2. Description of the Prior Art

In the current semiconductor industry, polysilicon has been widely used as a gap-filling material for fabricating gate electrodes of metal-oxide-semiconductor (MOS) transistors. However, the conventional polysilicon gate also faces problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, threshold voltages in current FinFET cannot be easily adjusted by using ion implantation. Hence, how to resolve this issue in today's FinFET architecture has become an important task in this field.

SUMMARY OF THE INVENTION

It is one of the primary objectives of the present invention to provide a method of forming a semiconductor device having different work function layers, in which a novel etching chemical is used to avoid damaging the work function layers during etching processes.

To achieve the purpose described above, the present invention provides a method of forming a semiconductor device including following steps. First of all, a first work function layer is formed on a substrate. Next, a first patterned photoresist layer is formed on the first work function layer. Then, the first work function layer is partially removed by using the first patterned photoresist layer as a mask to form a patterned first work function layer. Subsequently, the first patterned photoresist layer is removed by providing radical oxygen.

In the method of forming a semiconductor device of the present invention, work function layers in different thicknesses are formed indifferent transistor regions through different photoresist layers. Then, those photoresist layers are removed through a wet cleaning process by using a cleaning agent of radical oxygen, such as dilute ozone ($DIO_3$) and/or hydrogen peroxide ($H_2O_2$). In this way, the residue polymers, such as $C_xH_yF_z$ composition, generated while patterning the work function layer are easily removed via the cleaning processes, so as to obtain a preferable cleaning ability in the present invention. Also, the work function layers may also obtain preferable surfacing, since a slight amount of the work function layers may also be oxidized to generate a uniform and compact surface.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
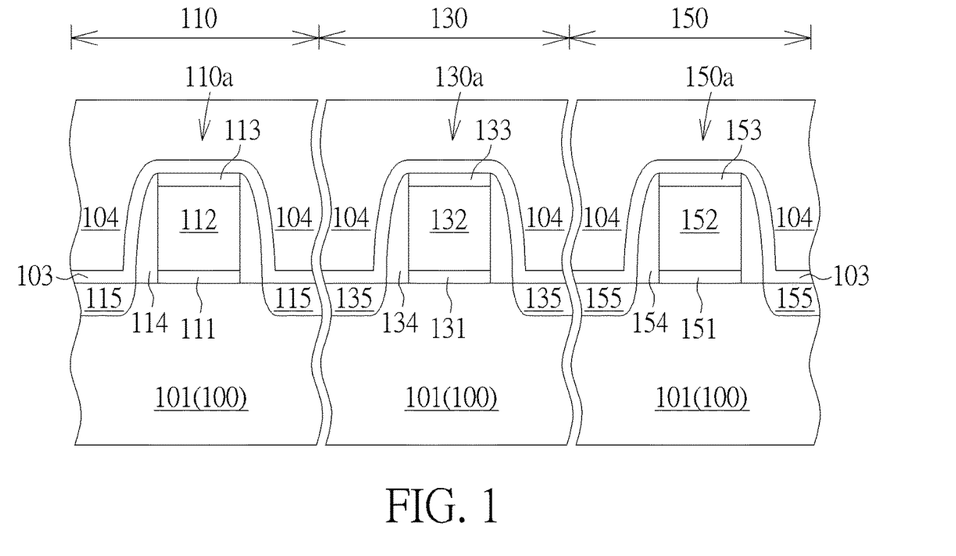
FIG. 1 to FIG. 6 are schematic diagrams illustrating a method of forming a semiconductor device in accordance with a first embodiment of the present invention.

Please refer to FIG. 1 to FIG. 4, which are schematic diagrams illustrating a method of forming a semiconductor device according to the first embodiment of the present invention. First of all, as shown in FIG. 1, a substrate 100 is provided. The substrate 100 for example includes a semiconductor substrate, such as a silicon substrate, a silicon-containing substrate or a silicon-on-insulator (SOI) substrate. Then, three transistor regions 110, 130, 150 are defined on the substrate 100. The three transistor regions 110, 130, 150 are preferably composed of transistors of the same conductive type, such as PMOS transistors or NMOS transistors, but not limited thereto. In one embodiment of the present invention, the three transistor regions 110, 130, 150 are configured to fabricate gate structures having different threshold voltages (Vt) afterwards. Please note that, although three transistor regions 110, 130, 150 composed of transistors of the same conductive type are exemplified in the present embodiment, the quantity of the transistor region, as well as the conductive type of the transistor composed thereof, is not limited to the aforementioned disclosures, but may be adjusted according to the demand of the practical process. For example, in other embodiments, two transistor regions composed of transistors in different conductive type, or four transistor regions composed of transistors in different conductive type may also be applied in the present invention.

Also, at least one fin shaped structure 101 and an insulating layer (not shown in the drawings) are formed in the substrate 100, wherein a bottom portion of the fin shaped structure 101 is surrounded by the insulating layer, for example being surrounded by silicon oxide, which may be performed as a shallow trench isolation (STI). In one embodiment, the fin shaped structures 101 may be formed preferably through forming a patterned mask layer (not shown in the drawings) on the substrate 100 and transferring the patterns of the patterned mask layer to the substrate 100. Next, depending on the structural difference of a tri-gate transistor or a dual-gate fin-shaped transistor being fabricated, the patterned mask layer may be partially removed selectively or retained, and deposition, chemical mechanical polishing (CMP), and etching back processes are carried out to form the insulating layer.

Alternatively, in another embodiment, the formation of the fin shaped structures 101 may also be accomplished by forming a patterned hard mask layer (not shown in the drawings) on the substrate 100, and then performing an epitaxial process on the exposed substrate 100 through the patterned hard mask layer to form a semiconductor layer (not shown in the drawings), such as silicon or silicon germanium layer. The semiconductor layer may then be used as the corresponding fin-shaped structure. Otherwise, in another embodiment, if the substrate is an SOI substrate (not shown in the drawing), the formation of the insulating layer may be omitted, and the patterned mask layer may be used to etch a semiconductor layer (not shown in the drawing) on the substrate until reaching a bottom oxide layer (not shown in the drawing) underneath, to form the corresponding fin-shaped structures.

Next, three metal gate structures may be formed on the substrate 100 for example through a "gate-last" process and a "high-k last" process. In one embodiment, three dummy gate structures 110a, 130a, 150a as shown in FIG. 1 may be firstly formed by sequentially stacking an interfacial material layer (not shown in the drawings), a sacrificial gate material layer (not shown in the drawings) and a capping material layer (not shown in the drawings) across the fin shaped structure 101 from bottom to top, and then patterning those stacked layers. The dummy gate structures 110a, 130a, 150a include interfacial layers 111, 131, 151, such as silicon oxide, silicon nitride, silicon oxynitride or suitable high-k dielectric materials; dummy gate electrodes 112, 132, 152, such as doped polysilicon material, undoped polysilicon material or amorphous silicon material; and capping layers 113, 133, 153, composed of monolayered or multilayered structures, respectively. Moreover, monolayered or multilayered spacers 114, 134, 154 are formed respectively on sidewalls of the dummy gate structure 110a, 130a, 150a, and source/drain regions 115, 135, 155 are formed at two sides of the dummy gate structures 110a, 130a, 150a respectively, wherein the spacers 114, 134, 154 may include high temperature oxide (HTO), silicon nitride, silicon oxide, silicon oxynitridd, or silicon nitride formed by hexachlorodisilane ($Si_2Cl_6$) (HCD-SiN). Subsequently, a contact etch stop layer (CESL) 103 may be formed to cover the entire dummy gates 110a, 130a, 150a, and an interlayer dielectric layer (ILD) 104, such as a silicon oxide layer or a tetraethyl orthosilicate (TEOS) layer may be formed to cover the CESL 103.

Figure 2:
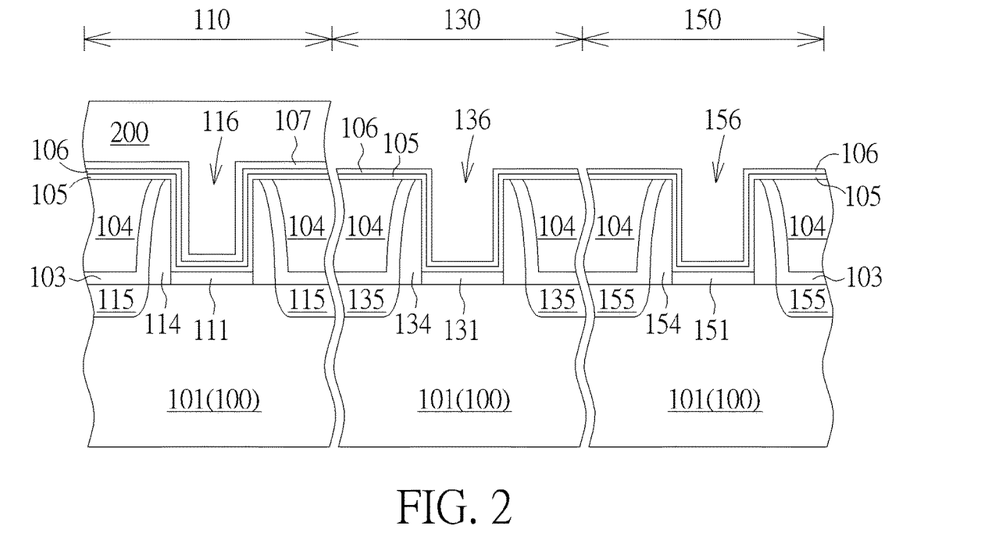

Following these, the ILD layer 104 and the CESL 103 are planarized up to the exposure of the dummy gate structures 110a, 130a 150a, and a dry etching process, a wet etching process or a sequentially performed dry and wet etching process is selectively performed to remove all of the capping layers 113, 133, 153 and the dummy gate electrodes 112, 132, 152 by using an etchant, such as ammonium hydroxide ($NH_4OH$) or tetramethylammonium hydroxide (TMAH), so that, three gate trenches 116, 135, 156 as shown in FIG. 2 are formed in the ILD layer 104 with the interfacial layers 111, 131, 151 remaining in the three gate trenches 116, 135, 156, respectively. In one embodiment, the interfacial layers 111, 131, 151 may also be removed while the capping layers 113, 133, 153 and the dummy gate electrodes 112, 132, 152 are removed, and U-shaped interfacial layers (not shown in the drawings) in the gate trenches 116, 136, 156 may be selectively formed before high-k dielectric layers are formed in the subsequent process.

Further in view of FIG. 2, a high-k dielectric layer 105 and a bottom barrier metal (BBM) layer 106 are deposited sequentially on the substrate 100 for example through an atomic layer deposition (ALD) process or metal-organic chemical vapor deposition (MOCVD) process, to cover the fin shaped structure 101 and to fill in the gate trenches 116, 136, 156. In one embodiment, the high-k dielectric layer 105 may include dielectric materials having dielectric constants (k value) larger than 4, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof; and the BBM layer 106 may include a monolayered or multilayered structure, such as including titanium (Ti), tantalum (Ta), titanium nitride (TiN) or tantalum nitride (TaN), but not limited thereto.

Then, a work function layer 107 is formed on the BBM 106, within the transistor region 110. Precisely, the formation of the work function layer 107 for example includes forming a work function layer (not shown in the drawings) on the fin shaped structure 101 for example through an ALD process or a MOCVD process, to at least fill in the trenches 116, 136, 156, forming a patterned mask, such as a patterned photoresist layer 200, to cover the transistor region 110, and removing the exposed work function layer formed within the transistor regions 130, 150 by using the patterned photoresist layer 200 as a mask, to only retain the work function layer formed within the transistor region 110, and to form the work function layer 107 filled in the gate trench 116, within the transistor region 110. The work function layer 107 is configured to tune work function of the metal gates so that the device could be adapted in an NMOS or a PMOS transistor. For example, if the transistor is an PMOS transistor, the work function layer 107 required by the PMOS transistor may include titanium nitride, tantalum nitride, tantalum carbide (TaC); and if the transistor is an NMOS transistor, the work function layer 107 required by the NMOS transistor may include titanium aluminide (TiAl), zirconium aluminide (ZrAl), tungsten aluminide (WAl), tantalum aluminide (TaAl), hafnium aluminide (HfAl), or titanium aluminum carbide (TiAlC); but is not limited thereto. In one embodiment, the deposited work function layer 107 is preferably a p-type work function layer having a thickness of about 10 angstroms to 20 angstroms, but is not limited thereto.

Figure 3:
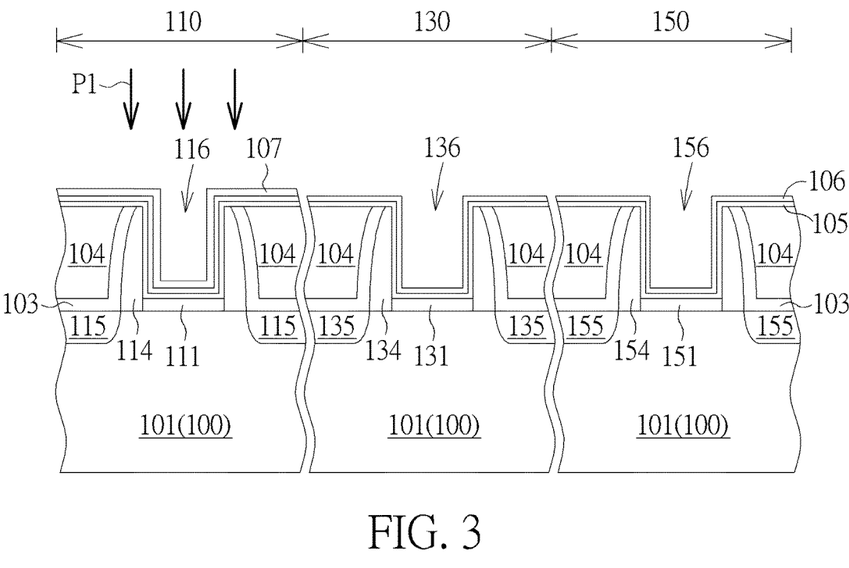

In the following, as shown in FIG. 3, a first cleaning process P1 is performed to remove the patterned photoresist layer 200. Precisely, the first cleaning process P1 preferably includes a wet cleaning process, for example removing the patterned photoresist layer 200 by using a cleaning agent of radical oxygen (also known as reactive oxygen), such as dilute ozone ($DIO_3$) and/or hydrogen peroxide ($H_2O_2$). It is noted that, while a part of the work function layer is removed in the forehanded process, some residue polymers, such as $C_xH_yF_z$ composition, may be generated because of either the damaging of the photoresist layer 200 or the etching residue. However, those residue polymers may be oxidized in the first cleaning process P1, such that, the hydroxyl groups which is easily bonded to water in those residue polymers may be increased accordingly, so as to be easily removed through cleaning. In other words, the first cleaning process P1 actually removes the patterned photoresist layer 200 via an oxidation treatment with the radical oxygen, so that a preferable cleaning ability is obtained. It is also noted that, through such oxidation treatment with the radical oxygen, a slight amount of the work function layer 107 may be oxidized too, so that, a uniform and compact surface may be formed on surfaces of the work function layer 107, thereby improving the surfacing of the work function layer 107 without causing any damages thereto.

Figure 4:
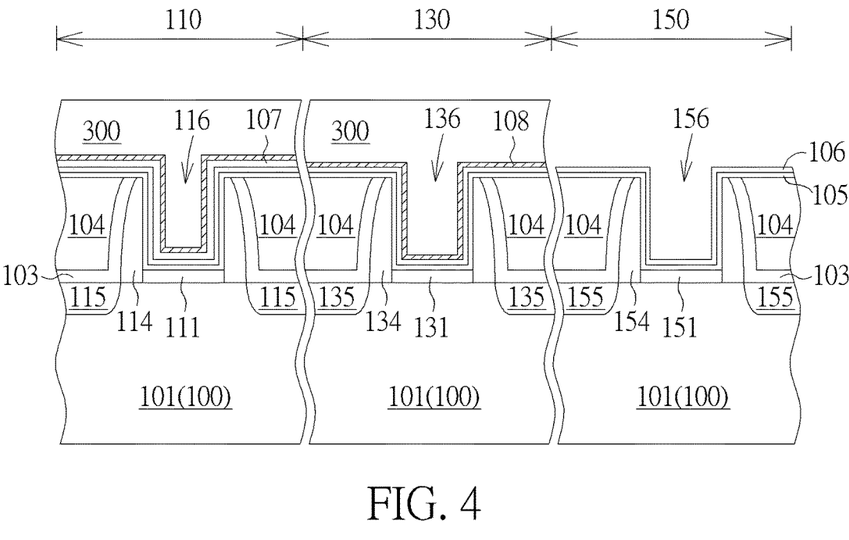

Next, as shown in FIG. 4, another work function layer 108 is selectively formed only in the transistor regions 110, 130. The formation of the work function layer 108 for example includes forming another work function layer (not shown in the drawings) on the fin shaped structure 101 to at least fill in the gate trenches 116, 136, 156, forming another patterned mask, such as a patterned photoresist layer 300, to cover the transistor regions 110, 130 and removing the exposed work function layer formed within the transistor region 150 by using the patterned photoresist layer 300 as a mask, thereby retaining the work function layer formed within the transistor regions 110, 130 to form the work function layer 108 filled in the gate trenches 116, 136 in the transistor regions 110, 130, respectively. Precisely, the work function layer 108 is formed on the work function layer 107 retained in the transistor region 110, wherein the detailed materials of the work function layer 108 may all be similar to those of the aforementioned work function layer 107.

In one embodiment, the work function layer 108 may also preferably include a P-type work function layer (for example, including titanium nitride) having a different thickness from that of the work function layer 107, for example around 10 angstroms to 7 angstroms, thereby tuning different work function values in the transistors formed subsequently in the transistor regions 110, 130. It is worth mentioning that, since the preferable surface treatment is obtained by the work function layer 107 during the aforementioned wet cleaning process, the work function layer 108 deposited sequentially thereon may also obtain better uniformity and surfacing, accordingly.

Figure 5:
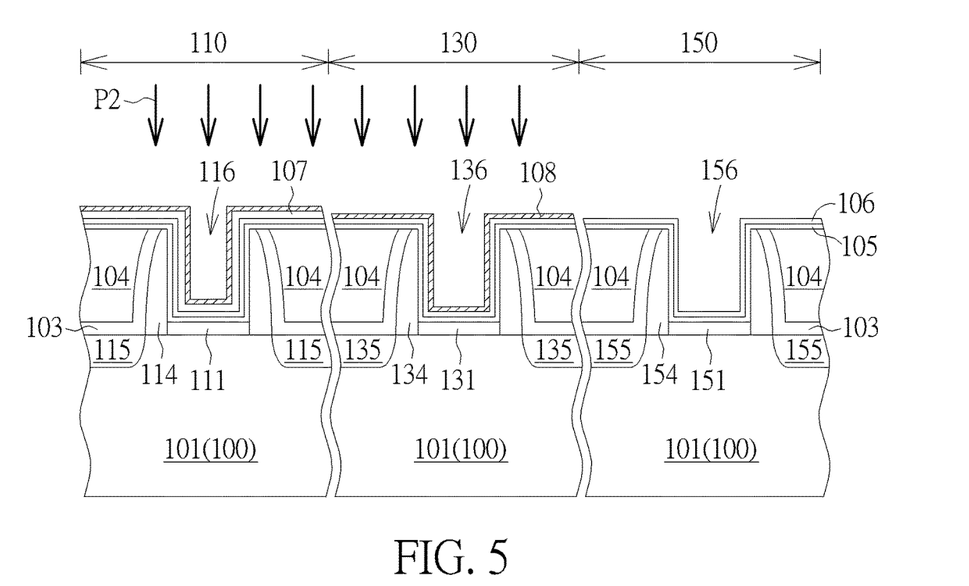

As shown in FIG. 5, similar to the aforementioned processes, the patterned photoresist layer 300 is removed through a second cleaning process P2, such as a wet cleaning process by using the cleaning agent of radical oxygen, such as $DIO_3$ and/or hydrogen peroxide ($H_2O_2$). Likewise, the cleaning agent of radical oxygen used in the second cleaning process P2 may oxidize the residue polymers generated while removing a part of the work function layer and the photoresist layer 300, thereby increasing the hydroxyl groups which is easily bonded to water in those residue polymers. In this way, the residue polymers are easily removed in the second cleaning process P2, so as to obtain a preferable cleaning ability in the present invention. Furthermore, the work function layer 107 may also obtain preferable surfacing, since a slight amount of the work function layer 108 may also be oxidized to generate a uniform and compact surface.

Figure 6:
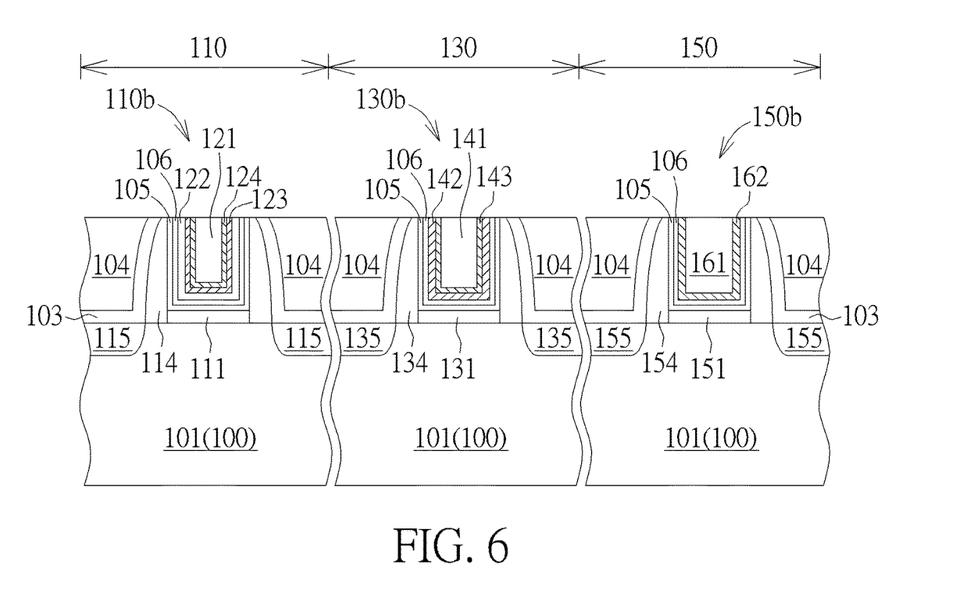

Then, another work function layer (not shown in the drawings) which has a different thickness from the work function layers 107, 108 is formed to cover the transistor regions 110, 130, 150 without removing another portion of the work function layer in the three transistor regions 110, 130, 150. The detailed materials and characteristic of the work function layer are all similar to those of the aforementioned work function layer 108 and will not be further detailed herein. Next, a conductive layer (not shown in the drawings) is formed on the work function layer, and a planarization process is performed to form three gate structures 110b, 130b, 150b as shown in FIG. 6. In one embodiment, a top barrier metal (TBM) layer (not shown in the drawings) may be formed additionally before the conductive layer is formed, but is not limited thereto, wherein the TBM layer may include the same or similar material are that of the aforementioned BBM layer 106 and will not be further detailed herein.

Precisely, the gate structures 110b formed in the transistor region 110 has a gate layer 121 and three work function layers, including a work function layer 122 formed by the work function layer 107, a work function layer 123 formed by the work function layer 108, and the work function layer 124 formed in the end; the gate structures 130b formed in the transistor region 130 has a gate layer 141 and two work function layers, including a work function layer 142 formed by the work function layer 108, and the work function layer 143 formed in the end; and the gate structures 150b formed in the transistor region 150 has a gate layer 161 and only one work function layer 162 formed in the end.

Through the aforementioned steps, the semiconductor device according to the first embodiment of the present invention can be obtained. In the present embodiment, the gate structures formed in the three transistor regions include the same conductive type, with all of the gate structures being P-type or N-type, for example, but have different threshold voltages by obtaining work function layers with different thicknesses. It is noted that, the photoresist layers used to form such work function layers in the present embodiment are removed through the wet cleaning process, in which a cleaning agent of radical oxygen, such as dilute ozone ($DIO_3$) and/or hydrogen peroxide ($H_2O_2$) may be used to oxidize the residue polymers generated while patterning the work function layer. In this way, the residue polymers are easily removed via the cleaning processes, so as to obtain a preferable cleaning ability in the present invention. Furthermore, the work function layers may also obtain preferable surfacing, since a slight amount of the work function layers may also be oxidized to generate a uniform and compact surface. Thus, the gate structures formed in three transistor regions may obtain precise threshold voltages differences because the thicknesses of the work function layers have been precisely controlled, with the inaccuracy between the center Vt and the edge Vt in each transistor region being minimized to less than 5 mv, so as to form N-type or P-type transistors having precisely controlled high threshold voltage (HVT), low threshold voltage (LVT) or standard threshold voltage (SVT) in different transistor region.

However, people who are skilled in the art shall realize the method of forming the semiconductor device in the present invention is not limited to the aforementioned steps, and may also include other processes. Thus, the following description will detail the different embodiments of the method of forming the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
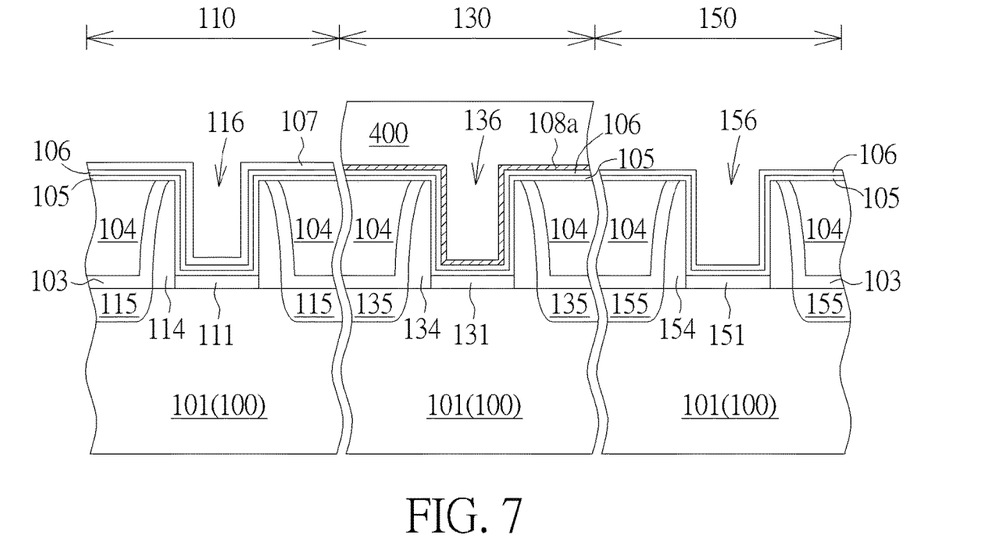
FIG. 7 to FIG. 8 are schematic diagrams illustrating a method of forming a semiconductor device in accordance with a second embodiment of the present invention.
Figure 8:
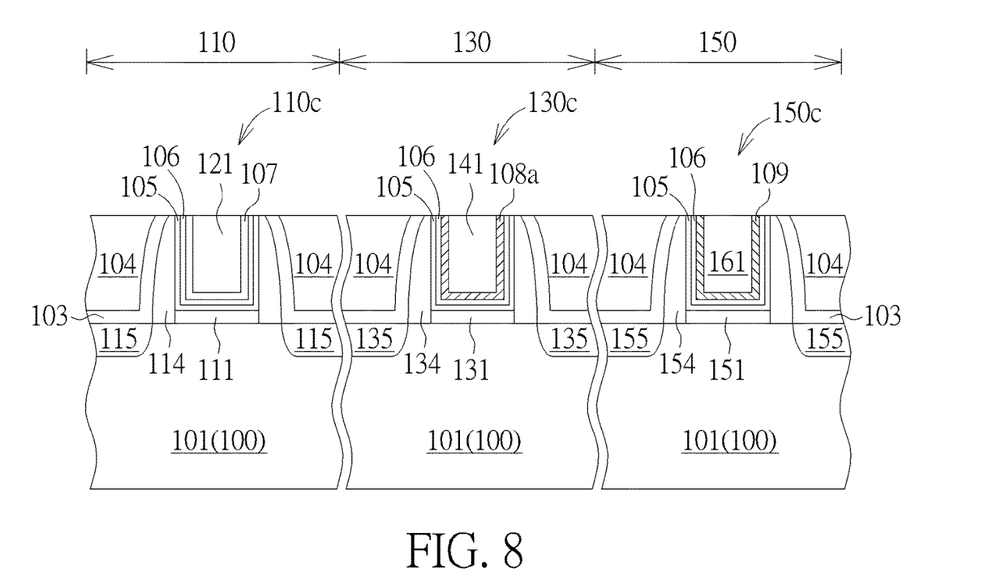
Figure 9:
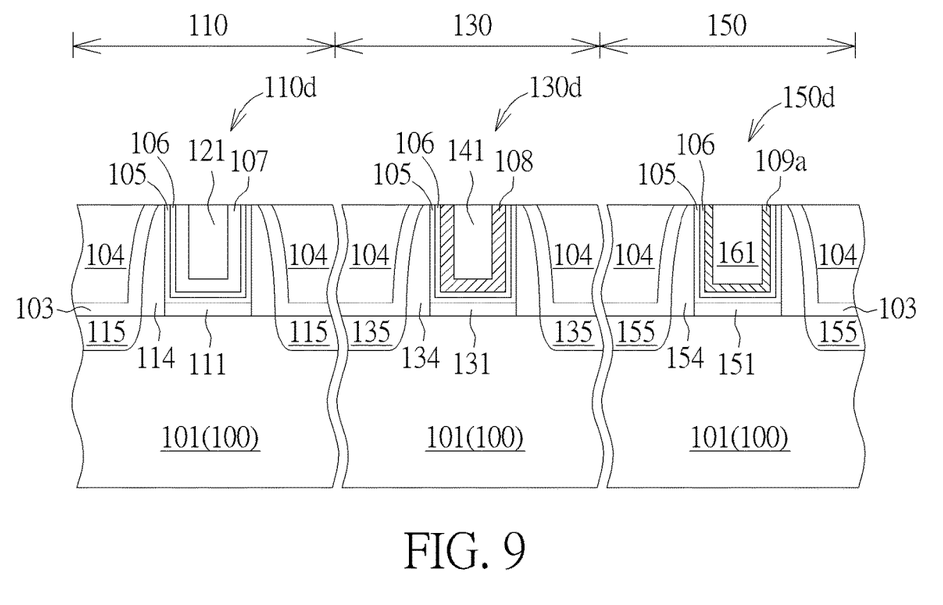
FIG. 9 is a schematic diagram illustrating a method of forming a semiconductor device in accordance with a third embodiment of the present invention.

Please refer to FIG. 7 to FIG. 8, which are schematic diagrams illustrating a method of forming a semiconductor device according to the second embodiment of the present invention. The forming method of the present embodiment is substantially similar to those in the aforementioned first embodiment shown in FIG. 1 to FIG. 3, and which includes defining three transistor regions 110, 130, 150 having the same conductive type on the substrate 100. It is noted that, the differences between the present embodiment and the aforementioned first embodiment is in that after removing the patterned photoresist layer 200, work function layers 108 and 109 having different thicknesses from the work function layer 107 are formed in the gate trenches 136, 156 in the transistor regions 130, 150 individually, to form three gate structures 110c, 130c, 150c as shown in FIG. 9.

Precisely speaking, the formation of the work function layer 108 in the present embodiment for example includes forming the work function layer (not shown in the drawings) on the fin shaped structure 101 to at least fill in the gate trenches 116, 136, 156, forming another patterned mask, such as a patterned photoresist layer 400, to cover the transistor region 130 and removing the exposed work function layer formed within the transistor regions 110, 150 by using the patterned photoresist layer 400 as a mask, thereby retaining the work function layer only within the transistor region 130 to form the work function layer 108a as shown in FIG. 7.

Similar to the aforementioned processes, the patterned photoresist layer 400 is removed through another cleaning process (not shown in the drawings), such as a wet cleaning process by using the cleaning agent of radical oxygen, such as $DIO_3$ and/or hydrogen peroxide ($H_2O_2$). In this way, the patterned photoresist layer 400 may be easily removed without leading to any damages to the work function layer 108, and also obtaining preferable surfacing via the same oxidation treatment with the radical oxygen for the similar aforementioned reasons.

Then, another work function layer 109 is finally formed only in the transistor region 150. The detailed materials and formation process of the work function layer 109 are all similar to those of the aforementioned work function layers 107, 108 and will not be further detailed herein. Next, a conductive layer (not shown in the drawings) is formed on the work function layer, and a planarization process is performed to form three gate structures 110c, 130c, 150c as shown in FIG. 8. It is noted that, the three gate structures 110c, 130c, 150c formed in the transistor regions 110, 130, 150 all include gate layers 121, 141, 161 and different work function layers 107, 108a, 109 respectively, with each of the work function layers 107, 108, 109 all including a P-type or an N-type work function layer in different thicknesses, thereby forming N-type or P-type transistors with a high threshold voltage (HVT), a low threshold voltage (LVT) or a standard threshold voltage (SVT) in the semiconductor device.

Please refer to FIG. 9, which is a schematic diagram illustrating a method of forming a semiconductor device in accordance with the third embodiment of the present invention. The forming method of the present embodiment is substantially similar to the process shown in FIG. 7 to FIG. 8 of the aforementioned second embodiment. However, the differences between the present embodiment and the aforementioned second embodiment is in that the transistor regions 110, 130 have the same conductive type, and the transistor regions 150 has different conductive types from that of the transistor regions 110, 130. For example, if the transistor regions 110, 130 are composed of PMOS transistors, respectively, and the transistor region 150 is composed of an NMOS transistor. Precisely, gate structures 110d, 130d, 150d are formed individually in the three transistor regions 110, 130, 150, wherein the gate structures 110d, 130d, 150d may be composed of different work function layers 107, 108, 109a. For example, the work function layers 107 108 of the gate structures 110d, 130d formed in the transistor region 110, 130 all include a P-type work function layer, and the work function layer 109a of the gate structures 150d formed in the transistor region 150 includes an N-type work function layer. Except for the aforementioned differences, other characteristics and detailed formation processes are all similar to those of the second embodiment, and will not be further detail herein.

Through the aforementioned two embodiments, the gate structures formed in the three transistor regions may include the same or different conductive types. It is noted that, the photoresist layers used in the present embodiments are also removed through the wet cleaning process, by using a cleaning agent of radical oxygen, such as dilute ozone ($DIO_3$) and/or hydrogen peroxide ($H_2O_2$). The cleaning agent of radical oxygen used in the second cleaning process may oxidize the residue polymers generated while patterning the work function layer or removing the photoresist layer 300, thereby increasing the hydroxyl groups which are easily bonded to water in those residue polymers. In this way, the residue polymers are easily removed via the cleaning, so as to obtain a preferable cleaning ability. Furthermore, the work function layers may also obtain preferable surfacing, since a slight amount of the work function layers may also be oxidized to generate a uniform and compact surface. Thus, the gate structures formed in three transistor regions may obtain precise threshold voltage differences because the thicknesses of the work function layers have been precisely controlled, with the inaccuracy between the center Vt and the edge Vt in each transistor region being minimized to less than 5 mv, thereby forming N-type or P-type transistors having precisely controlled high threshold voltage (HVT), low threshold voltage (LVT) or standard threshold voltage (SVT) in different transistor regions.

Additionally, although the aforementioned embodiments are all exemplified as a "gate-last" process and a "high-k last" process, the forming method of the present invention is not limited thereto. Also, in another embodiment, the forming method of the present invention may also be carried out in accordance with a "gate-first" process or a "high-k first" process or through other metal gate forming process, however.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    forming a first work function layer on a substrate;
    forming a first patterned photoresist layer on the first work function layer;
    partially removing the first work function layer by using the first patterned photoresist layer as a mask to form a patterned first work function layer, wherein a plurality of CxHyFz polymers is formed while partially removing the first work function layer; and
    removing the first patterned photoresist layer by providing radical oxygen, wherein the entire removing of the first patterned photoresist layer is performed with the radical oxygen, the CxHyFz polymers are oxidized by the radical oxygen and surfaces of non-removed first work function layer are also oxidized by the radical oxygen to obtain precise threshold voltage (Vt) differences between transistor regions by minimizing inaccuracy between a center Vt and an edge Vt in each of the transistor regions to less than 5 my.

2. The method of forming a semiconductor device of claim 1, wherein the radical oxygen comprises hydrogen peroxide ($H_2O_2$) or dilute ozone ($DIO_3$).

3. The method of forming a semiconductor device of claim 1, wherein the first work function layer comprises titanium nitride.

4. The method of forming a semiconductor device of claim 1, wherein the first patterned photoresist layer is removed through a wet process or a thermal oxidation process.

5. The method of forming a semiconductor device of claim 1, further comprising:
forming a high-k dielectric layer on the substrate, wherein the first work function layer is formed on the high-k dielectric layer.

6. The method of forming a semiconductor device of claim 1, further comprising:
forming a second work function layer on the patterned first work function layer;
forming a second patterned photoresist layer on the second work function layer;
partially removing the second work function layer by using the second patterned photoresist layer as a mask to form a patterned second work function layer; and
removing the second patterned photoresist layer by providing radical oxygen.

7. The method of forming a semiconductor device of claim 6, wherein the first work function layer and the second work function layer comprise the same conductive type.

8. The method of forming a semiconductor device of claim 6, wherein the substrate comprises a first region and a second region, and the patterned first work function layer is formed on the first region and the patterned second work function layer is formed on the second region.

9. The method of forming a semiconductor device of claim 6, wherein the substrate comprises a first region and a second region, and the patterned first work function layer is formed on the first region and the patterned second work function layer is formed on the first region and the second region.

10. The method of forming a semiconductor device of claim 6, wherein the second work function layer comprises titanium nitride.

11. The method of forming a semiconductor device of claim 1, further comprising:
forming a fin shaped structure in the substrate, wherein the first work function layer is formed on the fin shaped structure.

12. The method of forming a semiconductor device of claim 6, further comprising:
forming a third work function layer on the patterned second work function layer;
forming a third patterned photoresist layer on the third work function layer;
partially removing the third work function layer by using the third patterned photoresist layer as a mask to form a patterned third work function layer; and
removing the third patterned photoresist layer by providing radical oxygen.

13. The method of forming a semiconductor device of claim 12, wherein the first work function layer and the second work function layer comprise the same conductive type, and the third work function layer comprises a different conductive type from the first work function layer.

14. The method of forming a semiconductor device of claim 13, wherein the first work function layer and the second work function layer is P-type, and the third work function layer is N-type.

15. The method of forming a semiconductor device of claim 12, wherein the substrate comprises a first region, a second region and a third region, and the patterned first work function layer is formed on the first region, the patterned second work function layer is formed on the second region, and the patterned third work function is formed on the third region.

16. The method of forming a semiconductor device of claim 12, wherein the substrate comprises a first region, a second region and a third region, and the patterned first work function layer is formed on the first region, the patterned second work function layer is formed on the first region and second region, and the patterned third work function is formed on the first region, the second region and the third region.

* * * * *